United States Patent
Suzuki et al.

(10) Patent No.: US 6,517,229 B2
(45) Date of Patent: Feb. 11, 2003

(54) SPREAD ILLUMINATING APPARATUS HAVING HEAT SINK FUNCTION

(75) Inventors: Shingo Suzuki, Iwata-gun (JP); Koichi Toyoda, Iwata-gun (JP)

(73) Assignee: Minebea Co., Ltd., Kitasaku-gun (JP)

( * ) Notice: Subject to any disclaimer, the term of this patent is extended or adjusted under 35 U.S.C. 154(b) by 0 days.

(21) Appl. No.: 09/772,933

(22) Filed: Jan. 31, 2001

(65) Prior Publication Data

US 2001/0012203 A1 Aug. 9, 2001

(30) Foreign Application Priority Data

Feb. 8, 2000 (JP) ........................................ 2000-030539

(51) Int. Cl.[7] ............................................... F21V 29/00
(52) U.S. Cl. .......................... 362/580; 362/31; 362/294; 362/373
(58) Field of Search ............................. 302/31; 362/555, 362/559, 560, 561, 580, 294, 373, 800

(56) References Cited

U.S. PATENT DOCUMENTS

| | | | | |
|---|---|---|---|---|
| 5,528,474 A | * | 6/1996 | Roney et al. | 264/272.13 |
| 5,590,945 A | * | 1/1997 | Simms | 362/27 |
| 6,102,559 A | * | 8/2000 | Nold et al. | 340/468 |
| 6,286,970 B1 | * | 9/2001 | Egawa et al. | 362/31 |
| 6,293,683 B1 | * | 9/2001 | Okada | 362/26 |
| 6,305,813 B1 | * | 10/2001 | Lekson et al. | 362/26 |

* cited by examiner

Primary Examiner—Sandra O'Shea
Assistant Examiner—Ismael Negron
(74) Attorney, Agent, or Firm—Oliff & Berridge, PLC

(57) ABSTRACT

A spread illuminating apparatus radiating heat generated by a spot-like light source. The apparatus includes a metal enclosure (31) integrally formed at an end of a metal frame (27) so as to enclose a cover portion (14) which receives a spot-like light source (6) and dummy patterns (26) provided on inner surfaces of the first, second and third face portions (18, 20, 22) of the cover portion (14). The enclosure (31) functions as a heat sink and conducts heat generated by the spot-like light source (6) outwardly for radiation. Heat is conducted owing to the dummy patterns (26).

7 Claims, 3 Drawing Sheets

SPREAD ILLUMINATING APPARATUS HAVING HEAT SINK FUNCTION

BACKGROUND OF THE INVENTION

1. Field of the Invention

The present invention relates to a spread illuminating apparatus used as an illuminating means for signboards, various kinds of reflection-type display devices and so on, and more particularly to a spread illuminating apparatus used as an illuminating means for a liquid crystal display device.

2. Description of the Related Art

A demand for a liquid crystal display device as a display device mainly for computers has been increased since the liquid crystal display device which operates on low power consumption is characterized by being thin and lightweight. Since a liquid crystal which is a component of the liquid crystal display device does not emit light by itself unlike a light emitting element such as a picture tube, an illuminating means for viewing an image is required. In particular, in the recent demand for thinner devices, there is a growing tendency to employ a thin plate-like spread illuminating apparatus of side light type (light conductive plate type) as an illuminating means for illuminating the liquid crystal display device.

An example of such a side light type spread illuminating apparatus is shown in FIGS. 4 and 5.

In FIGS. 4 and 5, a spread illuminating apparatus 1 is generally composed of a transparent substrate 2 made of a light-transmissible material and a bar-like light source 3 disposed close to an end surface 2a of the transparent substrate 2. A liquid crystal display device (not shown) is disposed at a lower surface of the transparent substrate 2, and the spread illuminating apparatus 1 is used as an auxiliary illuminating apparatus for the liquid crystal display device.

The transparent substrate 2 is formed in a wedge-shape, in which as the distance from the end surface 2a increases, the thickness of the transparent substrate 2 gradually decreases.

The light source 3 is generally composed of a light conductive member 4 and a spot-like light source 6. The light conductive member 4 is made of a transparent material, formed in a triangular long plate-shape and disposed close to and along the end surface 2a of the transparent substrate 2, and the spot-like light source 6 is disposed facing an end 4a of the light conductive member 4 and is mounted on a printed wiring board 5 such as PCB, FPC or the like.

In addition, a surface (second surface of light conductive member) 4c of the light conductive member 4 opposing a surface (first surface of light conductive member) 4b that faces the transparent substrate 2 is slanted in plan view with respect to the first surface 4b of the light conductive member. The second surface 4c of the light conductive member is provided with an optical path conversion means 7 comprised of grooves 7a substantially triangular in section and plane portions 7b each formed between two adjacent grooves 7a, whereby although the spot-like light source 6 is disposed on the end 4a, light beams entering the light conductive member 4 at the end 4a are emitted uniformly from the first surface 4b of the light conductive member.

A light reflection pattern 8 is formed on a surface 2b of the transparent substrate 2 (the upper side in FIG. 4, and hereinafter referred to as upper surface), whereby the brightness is almost uniform everywhere on the transparent substrate 2 irrespective of the distance from the light conductive member 4.

The spot-like light source 6 is disposed on the printed wiring board 5 and a terminal of the board (not shown) is connected to a copper foil (not shown) by soldering.

Further, a light reflection member 11, which is made of a resin film and U-shaped, is disposed in such a manner as to cover longitudinal surfaces of the light conductive member 4 except the surface facing the transparent substrate 2 (the first surface 4b of the light conductive member) [covered are the surface opposing the first surface 4b of the light conductive member 4 (the second surface 4c of the light conductive member), and two substantially triangular surfaces extending in the longitudinal direction and orthogonal to and continuous with the second surface 4c of the light conductive member (the one on the upper side in FIG. 4 is referred to as third surface 4d of the light conductive member and the one on the lower side in FIG. 4 is referred to as fourth surface 4e of the light conductive member)] and a transparent substrate proximal portion 10, that is, a portion toward the end surface 2a of the transparent substrate 2.

In FIG. 5, adhesive 12 is applied to an area covering from the upper part of the spot-like light source 6 to the upper part of the light reflection member 11 and an area covering from the lower part of the printed wiring board 5 to the lower part of the light reflection member 11, and thus these components are bonded together.

In the spread illuminating apparatus, it is desired that heat generated by the spot-like light source be efficiently radiated in order, for example, to ease specifications for the spot-like light source and peripheral components thereof. This also applies to the conventional technique described above referring to FIGS. 4 and 5.

SUMMARY OF THE INVENTION

The present invention has been made in view of the above, and an object of the present invention is therefore to provide a spread illuminating apparatus with an enhanced efficiency of radiating heat generated by a spot-like light source.

According to a first aspect of the present invention, there is provided a spread illuminating apparatus in which a bar-like light source is disposed in the vicinity of an end surface of a transparent substrate made of a light-transmissible material, wherein the bar-like light source is composed of a light conductive member which is formed of a bar-like transparent material and disposed close to and along at least one of end surfaces of the transparent substrate, and a spot-like light source which is disposed on at least one end of the light conductive member and mounted on a printed wiring board, and wherein the spot-like light source is enclosed by an enclosure made of a material having a high heat conductivity.

According to a second aspect of the present invention, the spread illuminating apparatus of the first aspect of the invention comprises a frame which covers the light conductive member, further extends to a part in the vicinity of the end surface of the transparent substrate to hold fixedly the transparent substrate, and which includes the enclosure at its end.

According to a third aspect of the present invention, in the spread illuminating apparatus of the second aspect of the invention, the frame and the enclosure are integrally formed.

According to a fourth aspect of the present invention, in the spread illuminating apparatus of any one of the first to third aspects of the invention, the printed wiring board is composed of a substrate on which the spot-like light source is mounted and a cover portion which extends from the substrate in such a manner as to cover the spot-like light source and is provided with dummy patterns.

DETAILED DESCRIPTION OF THE PREFERRED EMBODIMENTS

Figure 1:
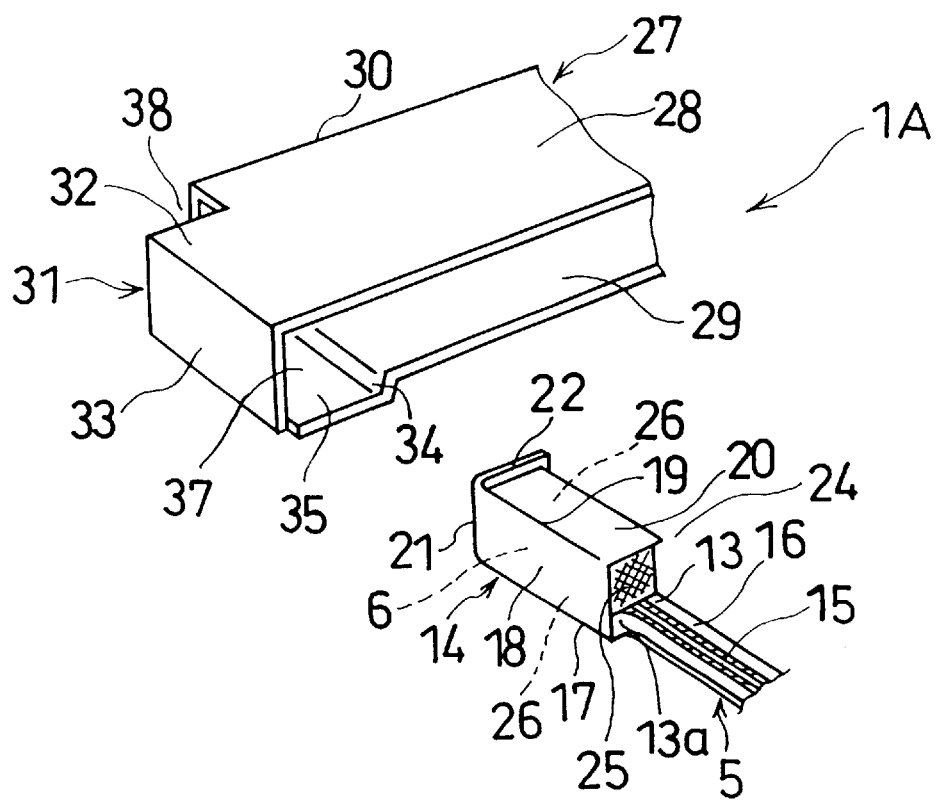
FIG. 1 is an exploded perspective view showing an embodiment of the present invention.
Figure 2:
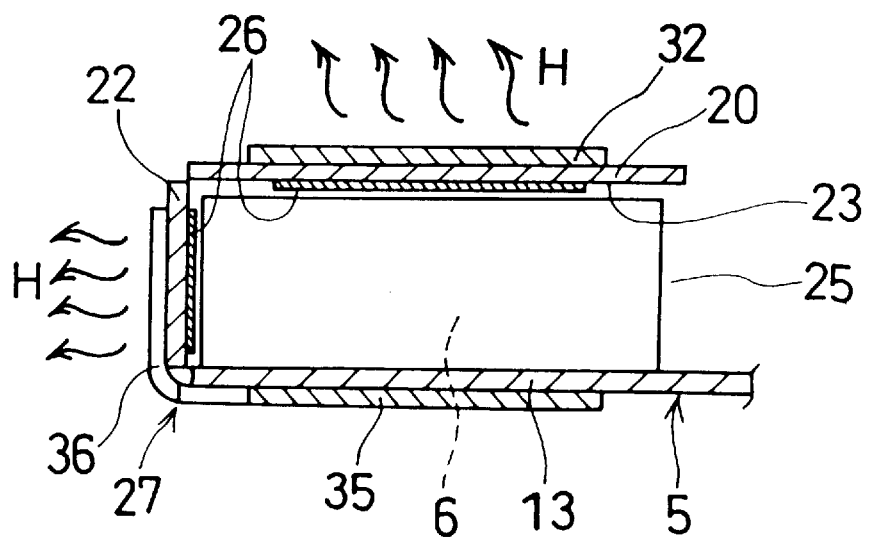
FIG. 2 is a side view showing a partial cross section of a frame and a printed wiring board in FIG. 1.
Figure 3:
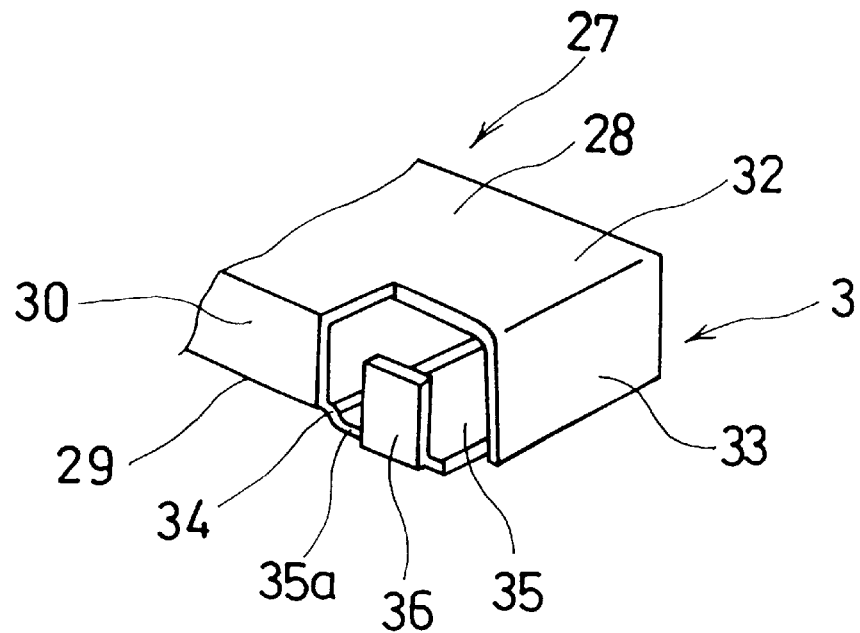
FIG. 3 is a perspective view of the frame in FIG. 1 viewed from another direction.
Figure 4:
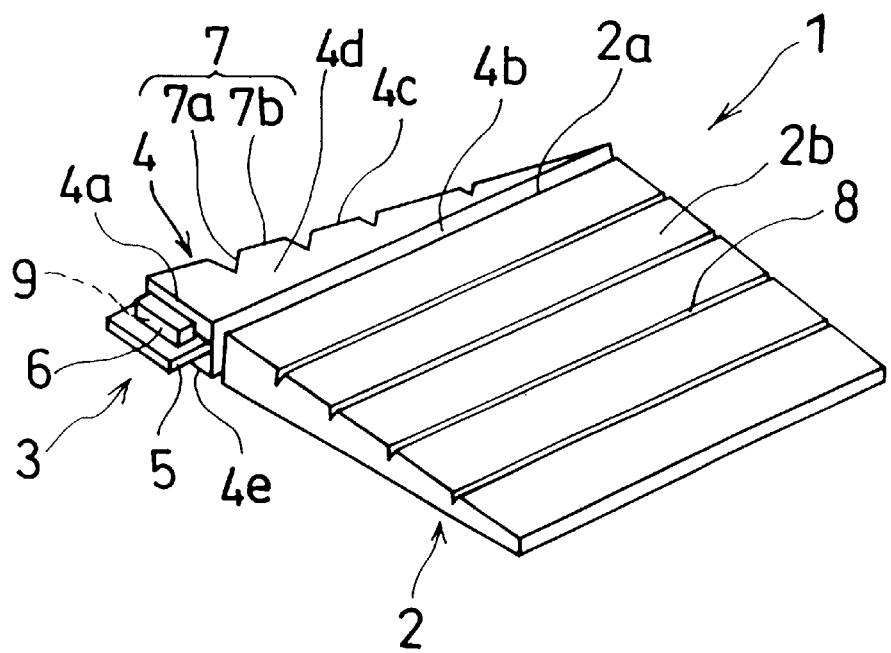
FIG. 4 is a perspective view showing an example of a conventional spread illuminating apparatus.
Figure 5:
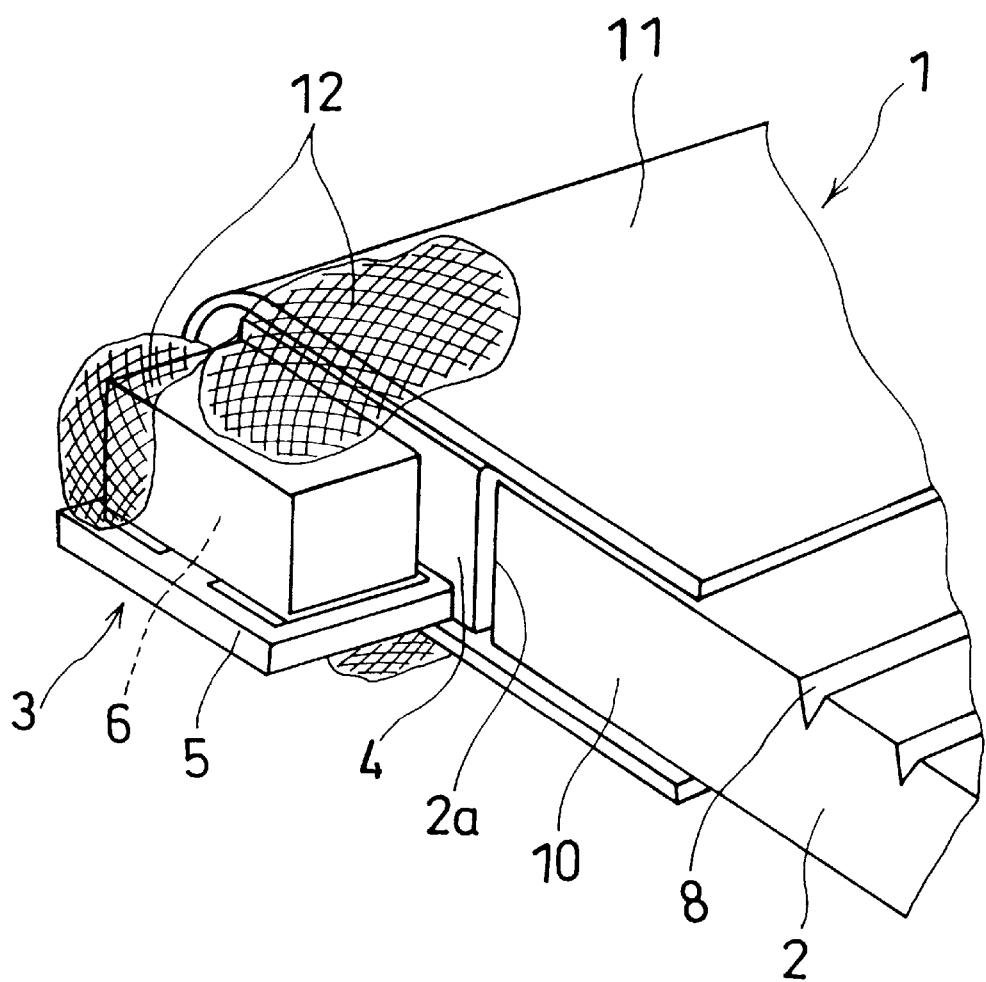
FIG. 5 is an enlarged view partially showing an example of the conventional spread illuminating apparatus.

A spread illuminating apparatus 1A according to a first embodiment of the present invention will be described with reference to FIGS. 1 to 3. Note that parts and components identical with those in FIGS. 4 and 5 are appropriately explained referring to those in FIGS. 4 and 5.

The spread illuminating apparatus 1A is generally composed of a transparent substrate 2 made of a light-transmissible material (see FIGS. 4 and 5) and a bar-like light source 3 disposed close to an end surface 2a of the transparent substrate 2. A liquid crystal display device (not shown) is disposed at a lower surface of the transparent substrate 2, and the spread illuminating apparatus 1A is used as an auxiliary illuminating apparatus for the liquid crystal display device.

The light source 3 is generally composed of a light conductive member 4 (see FIG. 4) and a spot-like light source 6. The light conductive member 4 is made of a transparent material, formed in a long plate-shape and disposed close to the end surface 2a of the transparent substrate 2, and the spot-like light source 6 comprises a light-emitting diode, is disposed facing an end 4a of the light conductive member 4 and is mounted on a printed wiring board 5.

The printed wiring board 5 is generally composed of a rectangular portion (substrate) 13 on which the spot-like light source 6 is mounted, a cover portion 14 extending from the substrate 13 to cover the spot-like light source 6, and an extension 16 extending from one short side 13a of the substrate 13 and connecting to an external power source (not shown) via copper foils 15.

The cover portion 14 is generally composed of a first face portion 18, a second face portion 20 and a third face portion 22. The first face portion 18 is a rectangular portion which extends from a long side of the substrate 13, via a bend (hereinafter referred to as first bend 17), in the direction perpendicular to the substrate 13. The second face portion 20 is a portion which extends from a long side of the first face portion 18, via a bend (hereinafter referred to as second bend 19), in the direction parallel with the substrate 13 and has almost the same shape as the substrate 13. The third face portion 22 is a rectangular portion which extends from a short side portion of the first face portion 18, via a bend (hereinafter referred to as third bend 21).

The spot-like light source 6 is housed in a space 23 defined by the substrate 13 and the first, second and third face portions 18, 20 and 22. The space 23 has non-definition (first opening 24) at the side opposing the first face portion 18, and the spot-like light source 6 and the printed wiring board 5 are arranged in such a manner that the first opening 24 faces an end 4a of the light conductive member 4 (the left side in FIG. 4). Accordingly, light from the spot-like light source 6 enters the light conductive member 4. Note that an opening located opposing the third face portion 22 in the cover portion 14 is referred to as second opening 25.

A dummy pattern 26 made of copper foil is provided on each of inner surfaces of the first face portion 18, the second face portion 20 and the third face portion 22 keeping clear of the first bend 17, the second bend 19 and the third bend 21.

The spread illuminating apparatus 1A is provided with a metal frame 27 which is substantially U-shaped in cross section. The frame 27 covers the light conductive member 4 and extends to a transparent substrate proximal portion 10 to hold fixedly the transparent substrate 2. The frame 27 has a rectangular shape and has a length substantially equal to the length of the transparent substrate 2.

The frame 27 is generally composed of opposing plates facing a third surface 4d and a fourth surface 4e of the light conductive member 4, respectively (the opposing plate facing the third surface 4d of the light conductive member is referred to as first opposing plate 28, and the opposing plate facing the fourth surface 4e of the light conductive member is referred to as second opposing plate 29.) and a proximal portion 30 which is substantially perpendicular to and continuous with the first and second opposing plates 28 and 29.

The frame 27 extends toward one end (the left side in FIG. 1) to form an enclosure 31 that encloses the substrate 13 and the cover portion 14.

The enclosure 31 is generally composed of an enclosure upper plate 32, an enclosure end plate 33, an enclosure lower plate 35 and an upright plate 36. The enclosure upper plate 32 extends from one end (the left side in FIG. 4) of the first opposing plate 28 and is narrower in width than the first opposing plate 28, the enclosure end plate 33 is bent orthogonally to the enclosure upper plate 32, the enclosure lower plate 35 extends, via a step 34 formed at an end of the second opposing plate 29, to reach an edge of the enclosure end plate 33, and the upright plate 36 is raised from a short side 35a of the enclosure lower plate 35, narrower than the short side 35a and less tall than the enclosure end plate 33.

An enclosure space 37 is defined by the enclosure upper plate 32, the enclosure end plate 33, the enclosure lower plate 35, and the upright plate 36. The substrate 13 and the cover portion 14 are enclosed in the enclosure space 37 as described above. In this case, the enclosure end plate 33 abuts the first face portion 18 of the cover portion 14 and the enclosure upper plate 32 abuts the second face portion 20.

Incidentally, the widths of the enclosure upper plate 32 and the enclosure end plate 33 are set smaller than that of the first opposing plate 28, and also the dimension of the upright plate 36 is set as described above. Consequently, a cutaway 38 is formed in the enclosure 31 as shown in FIGS. 1 and 3. The cutaway 38 is for convenience of inserting (operating) a blade for processing a sheet metal (not shown), or the like.

According to the embodiment of the present invention described above, the enclosure 31 which encloses the spot-like light source 6 (cover portion 14) is made of a metal and therefore has a high heat conductivity. Thus, the enclosure 31 works as a sort of heat sink, and easily conducts heat generated by the spot-like light source 6 outwardly for radiation.

Note that in this embodiment, heat H generated by the spot-like light source 6 is conducted to the enclosure 31 through the cover portion 14 to be radiated. The dummy pattern 26 provided at each of inner surfaces of the cover portion 14 (first, second and third face portions 18, 20 and 22) enables the heat H to be more efficiently conducted, thereby enhancing radiation efficiency.

In this embodiment, since the enclosure end plate 33 abuts the first face portion 18 of the cover portion 14, and the enclosure upper plate 32 abuts the second face portion 20, the conductivity is further improved, and as a result, the radiation efficiency is enhanced. Note that, in this embodiment, the enclosure end plate 33 abuts the first face portion 18 of the cover portion 14 and the enclosure upper plate 32 abuts the second face portion 20 as described above, but alternatively, the enclosure end plate 33 and the enclosure upper plate 32 may be spaced apart from the first face portion 18 and the second face portion 20, respectively.

Moreover, in this embodiment, the enclosure 31 is integrally formed with the frame 27, and therefore the number of components is reduced in comparison with a case where the enclosure 31 and the frame 27 are separately formed. Consequently, the structure becomes simple and productivity can be enhanced.

Further, in this embodiment, the enclosure 31 is in a substantially rectangular shape. However, the shape is not limited to this, and a curved shape such as a half-cylindrical shape may be adopted.

In this embodiment, the cover portion 14 is provided to cover the spot-like light source 6, but the cover portion 14 may not be provided.

In this embodiment, the enclosure 31 is composed of metallic members, but may alternatively be composed of other materials with a high heat conductivity.

Further, in this embodiment, the dummy pattern 26 is made of copper, but may alternatively be made of other materials such as aluminum.

According to the first aspect of the present invention, the enclosure which encloses the spot-like light source is made of metal and has a high heat conductivity. Thus, the enclosure works as a sort of heat sink, and easily conducts heat generated by the spot-like light source outwardly for radiation.

According to the second aspect of the present invention, the enclosure is provided at the end of the frame and can be stably retained in place.

According to the third aspect of the present invention, the enclosure is integrally formed with the frame, and therefore the number of components is reduced in comparison with a case where the enclosure and the frame are separately formed. Accordingly, the structure becomes simple and the productivity can be enhanced.

According to the fourth aspect of the present invention, the heat generated by the spot-like light source is more efficiently conducted owing to the dummy pattern, and thus the radiation efficiency can be enhanced.

What is claimed is:

1. A spread illuminating apparatus, comprising:
   a bar-like light source disposed in the vicinity of an end surface of a transparent substrate made of a light-transmissible material, wherein
   the bar-like light source is composed of a light conductive member and a spot-like light source;
   the light conductive member is made of a transparent material, formed bar-like and disposed close to and along at least one end surface of the transparent substrate, and
   the spot-like light source is disposed on at least one end of the light conductive member, mounted on a printed wiring board, and enclosed by an enclosure made of a material having a high heat conductivity.

2. A spread illuminating apparatus as claimed in claim 1, wherein the printed wiring board is composed of a substrate on which the spot-like light source is mounted and a cover portion which extends from the substrate in such a manner as to cover the spot-like light source and is provided with dummy patterns.

3. A spread illuminating apparatus as claimed in claim 1, wherein a frame is provided which covers the light conductive member, extends to a part in the vicinity of the end surface of the transparent substrate to hold fixedly the transparent substrate, and includes the enclosure at its end.

4. A spread illuminating apparatus as claimed in claim 3, wherein the printed wiring board is composed of a substrate on which the spot-like light source is mounted and a cover portion which extends from the substrate in such a manner as to cover the spot-like light source and is provided with dummy patterns.

5. A spread illuminating apparatus as claimed in claim 3, wherein the frame and the enclosure are integrally formed.

6. A spread illuminating apparatus as claimed in claim 3, wherein the printed wiring board is composed of a substrate on which the spot-like light source is mounted and a cover portion which extends from the substrate in such a manner as to cover the spot-like light source and is provided with dummy patterns.

7. A spread illuminating apparatus as claimed in claim 3, wherein the enclosure is composed of an enclosure upper plate extended from an upper plate of the frame, an enclosure end plate bent orthogonally to the enclosure upper plate, an enclosure lower plate extended via a step formed at an end of a lower plate of the frame to reach an edge of the enclosure end plate, and an upright plate bent orthogonally to a side of the enclosure lower plate.

* * * * *

UNITED STATES PATENT AND TRADEMARK OFFICE
CERTIFICATE OF CORRECTION

PATENT NO.    : 6,517,229 B2
DATED         : February 11, 2003
INVENTOR(S)   : Shingo Suzuki et al.

It is certified that error appears in the above-identified patent and that said Letters Patent is hereby corrected as shown below:

<u>Title page, Item [54] and Column 1, lines 2-3,</u>
Change title from: "SPREAD ILLUMINATING APPARATUS HAVING HEAT SINK FUNCTION" to: -- BAR-LIKE ILLUMINATING APPARATUS WITH HEAT CONDUCTION ENCLOSURE --.

<u>Column 6,</u>
Lines 7 and 10, change "light source" to -- lamp --.

Signed and Sealed this

Sixteenth Day of September, 2003

JAMES E. ROGAN
*Director of the United States Patent and Trademark Office*

UNITED STATES PATENT AND TRADEMARK OFFICE
CERTIFICATE OF CORRECTION

PATENT NO.      : 6,517,229 B2
DATED           : February 11, 2003
INVENTOR(S)     : Shingo Suzuki et al.

It is certified that error appears in the above-identified patent and that said Letters Patent is hereby corrected as shown below:

Title page, Item [54] and Column 1, lines 2-3,
Change title from: "SPREAD ILLUMINATING APPARATUS HAVING HEAT SINK FUNCTION" to: -- BAR-LIKE ILLUMINATING APPARATUS WITH HEAT CONDUCTING ENCLOSURE --.

Column 6,
Lines 7 and 10, change "light source" to -- lamp --;
Line 20, change "2" to -- 4 --;
Line 26, change "3" to -- 2 --;
Line 31, change "4" to -- 5 --;
Line 31, change "claim 3" to -- claim 2 --;
Line 37, change "5" to -- 3 --; and
Line 37, change "claim 3" to -- claim 2 --.

This certificate supersedes Certificate of Correction issued September 16, 2003.

Signed and Sealed this

Twenty-third Day of March, 2004

JON W. DUDAS
*Acting Director of the United States Patent and Trademark Office*